United States Patent
Giannikis et al.

(10) Patent No.: US 11,023,430 B2
(45) Date of Patent: Jun. 1, 2021

(54) SPARSE DICTIONARY TREE

(71) Applicant: Oracle International Corporation, Redwood Shores, CA (US)

(72) Inventors: Georgios Giannikis, Zurich (CH); Seema Sundara, Nashua, NH (US); Sabina Petride, Tracy, CA (US); Nipun Agarwal, Saratoga, CA (US)

(73) Assignee: Oracle International Corporation, Redwood Shores, CA (US)

(*) Notice: Subject to any disclaimer, the term of this patent is extended or adjusted under 35 U.S.C. 154(b) by 358 days.

(21) Appl. No.: 15/819,891

(22) Filed: Nov. 21, 2017

(65) Prior Publication Data
US 2019/0155925 A1    May 23, 2019

(51) Int. Cl.
*G06F 17/00*    (2019.01)
*G06F 16/21*    (2019.01)
(Continued)

(52) U.S. Cl.
CPC .......... *G06F 16/213* (2019.01); *G06F 16/221* (2019.01); *G06F 16/2246* (2019.01); *G06F 16/2255* (2019.01); *G06F 16/2282* (2019.01); *G06F 16/23* (2019.01); *G06F 16/2343* (2019.01); *H03M 7/00* (2013.01); *H03M 7/3088* (2013.01); *H03M 7/6058* (2013.01)

(58) Field of Classification Search
CPC .. G06F 16/213; G06F 16/221; G06F 16/2246; G06F 16/23; G06F 16/2343; G06F 16/2255; G06F 16/2282; H03M 7/00; H03M 7/3088; H03M 7/658
See application file for complete search history.

(56) References Cited

U.S. PATENT DOCUMENTS 5,440,735 A    8/1995  Goldring
6,954,758 B1   10/2005 O'Flaherty
(Continued)

OTHER PUBLICATIONS

Wust et al., "Sparse Dictionaries for In-Memory Column Stores", DBKDA 2012, 9 pages.
(Continued)

*Primary Examiner* — Tamara T Kyle
*Assistant Examiner* — Lahcen Ennaji
(74) *Attorney, Agent, or Firm* — Hickman Becker Bingham Ledesma LLP

(57) ABSTRACT

Techniques related to a sparse dictionary tree are disclosed. In some embodiments, computing device(s) execute instructions, which are stored on non-transitory storage media, for performing a method. The method comprises storing an encoding dictionary as a token-ordered tree comprising a first node and a second node, which are adjacent nodes. The token-ordered tree maps ordered tokens to ordered codes. The ordered tokens include a first token and a second token. The ordered codes include a first code and a second code, which are non-consecutive codes. The first node maps the first token to the first code. The second node maps the second token to the second code. The encoding dictionary is updated based on inserting a third node between the first node and the second node. The third node maps a third token to a third code that is greater than the first code and less than the second code.

18 Claims, 9 Drawing Sheets

(51) Int. Cl.
*G06F 16/22* (2019.01)
*G06F 16/23* (2019.01)
*H03M 7/30* (2006.01)
*H03M 7/00* (2006.01)

(56) References Cited

U.S. PATENT DOCUMENTS

| | | | |
|---|---|---|---|
| 7,647,291 B2 * | 1/2010 | Mosescu | G06F 16/2246 |
| | | | 707/999.001 |
| 10,474,652 B2 | 11/2019 | Baskett | |
| 2002/0174111 A1 | 11/2002 | Kougiouris | |
| 2004/0225673 A1 | 11/2004 | Beck | |
| 2006/0015510 A1 * | 1/2006 | Trask | G06F 7/24 |
| 2007/0050367 A1 | 3/2007 | Suganuma | |
| 2010/0030748 A1 | 2/2010 | Netz | |
| 2010/0262574 A1 * | 10/2010 | Zhou | G06N 5/02 |
| | | | 706/50 |
| 2010/0328115 A1 * | 12/2010 | Binnig | G06F 16/24561 |
| | | | 341/51 |
| 2011/0161387 A1 | 6/2011 | Krueger | |
| 2012/0124106 A1 * | 5/2012 | Allen | G06F 12/0276 |
| | | | 707/814 |
| 2013/0060780 A1 | 3/2013 | Lahiri | |
| 2013/0103701 A1 | 4/2013 | Vishnubhatta | |
| 2014/0317087 A1 | 10/2014 | Collins | |
| 2015/0074407 A1 | 3/2015 | Palmeri | |
| 2015/0178305 A1 * | 6/2015 | Mueller | G06F 16/221 |
| | | | 707/693 |
| 2015/0261882 A1 | 9/2015 | Roberts | |
| 2015/0278268 A1 | 10/2015 | El-Ali | |
| 2016/0147804 A1 | 5/2016 | Wein | |
| 2016/0241577 A1 * | 8/2016 | Johnson | G06F 16/278 |
| 2017/0031976 A1 * | 2/2017 | Chavan | G06F 16/2453 |
| 2017/0109406 A1 | 4/2017 | Chavan | |
| 2017/0242876 A1 | 8/2017 | Dubost | |
| 2018/0150494 A1 | 5/2018 | Schulze | |
| 2018/0211143 A1 | 7/2018 | Haruta | |
| 2018/0218020 A1 | 8/2018 | Dutta | |
| 2019/0155930 A1 | 5/2019 | Fender | |

OTHER PUBLICATIONS

Vagata et al., "Scaling the Facebook data warehouse to 300 PB", dated Apr. 10, 2014, 10 pages.
Sanders et al., "Optimize storage with deep compression in DB2 10", dated , May 17, 2012, 41 pages.
Patil et al., "Inverted Indexes for Phrases and Strings", SIGIR darted 2011, 10 pages. Binnig et al., "Dictionary-based order-preserving string compression for main memory column stores", ACM SIGMOD 2009, 13 pages.
Bentley, et al., "Fast Algorithms for Sorting and Searching Strings", SODA 1997, 10 pages.
Bender et al., "Anti-Persistence on Persistent Storage: History-Independent Sparse Tables and Dictionaries", PODS'16, Jun. 26-Jul. 1, 2016, San Francisco, CA, USA, 14 pages.
Antoshenkov et al., "Order Preserving Compression", ICDE, dated 1996.
Kandukuri, U.S. Appl. No. 15/861,212, filed Jan. 3, 2018, Office Action dated Jan. 3, 2020.
Fender, U.S. Appl. No. 15/897,375, filed Feb. 15, 2018, Office Action dated Jan. 17, 2020.
Fender, U.S. Appl. No. 15/819,193, filed Nov. 21, 2017, Office Action dated Dec. 27, 2019.
Westmann et al., "The Implementation and Performance of Compressed Databases", SIGMOD Rec., 29(3): pp. 55-67, 2000.
Ristov, Strahil, LZ Trie and Dictionary Compression, Software: Practice and Experience, vol. 35, Issue 5, pp. 445-465, Apr. 25, 2005.
Ray et al., "Database Compression: A Performance Enhancement Tool", Proc. of 7th Intl. Conf. on Management of Data, COMAD, 1995, 20 pages.
Poess et al., "Data Compression in Oracle", VLDB 2003: Proceedings of the 29th International Conference on Very Large Data Bases, pp. 937-947.
Palkar, et al., "Filter Before You Parse: Faster Analytics on Raw Data with Sparser", Proceedings of the VLDB Endowment, vol. 11, No. 11, dated 2018, 14 pages.
Mustard et al., "JumpGate: Towards In-Network Data Processing", dated 2019, 3 pages.
Kornacker et al., "Impala: A Modern, Open-Source SQL Engine for Hadoop", 7thBiennial Conference on Innovative Data Systems Research (CIDR'15) dated Jan. 4-7, 2015, 10 pages.
Farber et al., "Dictionary-based Order-preserving String Compression for Main Memory Column Stores", SIGMOD 2009, pp. 283-296.
Balkesen et al., "RAPID: In-Memory Analytical Query Processing Engine with Extreme Performance perWatt", SIGMOD'18, Jun. 10-15, 2018, Houston, TX, USA, 13 pages.
Agrawal et al., "A Many-core Architecture for In-Memory Data Processing", MICRO-50, Oct. 14-18, 2017, Cambridge, MA, USA, 14 pages.
Abadi et al., "Integrating Compression and Execution in Column-Oriented Database Systems", SIGMOD 2006, pp. 671-682.
Fender, U.S. Appl. No. 15/897,375, filed Feb. 15, 2018, Final Office Action, dated Jul. 24, 2020.
Fender, U.S. Appl. No. 16/155,740, filed Oct. 9, 2018, Final Office Action, dated Jan. 12, 2021.
Fender, U.S. Appl. No. 15/897,375, filed Feb. 15, 2018, Office Action, dated Jan. 1, 2021.
Fender, U.S. Appl. No. 16/155,740, filed Oct. 9, 2018, Advisory Action, dated Mar. 22, 2021.

* cited by examiner

SPARSE DICTIONARY TREE

TECHNICAL FIELD

Embodiments are generally related to information storage and retrieval technology. More specifically, embodiments are related to a sparse dictionary tree.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Dictionary Compression

Typically, a column of database data is stored in a compressed format to conserve space in memory. Often used is a lightweight compression technique known as "dictionary encoding", which enables data that comprises a relatively large number of bits to be represented by a relatively small number of bits. The relatively large number of bits corresponds to a value of database data and is hereinafter referred to as a "token". The relatively small number of bits corresponds to an encoded representation of the token and is hereinafter referred to as a "code". Tokens and codes exhibit a one-to-one relationship with each other.

In the example of FIG. 1, column 100 comprises a set of database values in an uncompressed format, and column 102 comprises the set of database values in a compressed format. Tokens 106 comprise the uncompressed values of column 100, and codes 108 comprise the encoded representations of tokens 106. Advantageously, column 102 stores codes 108 instead of tokens 106, thereby achieving a significant savings in memory utilization. As such, column 102 can fit in relatively fast but small memory, such as dynamic random-access memory (DRAM), where queries can be executed against it relatively quickly.

Although FIG. 1 depicts tokens 106 and codes 108 as values of particular data types, it should be appreciated that the particular data types used may vary from implementation to implementation. However, to realize space savings, codes 108 should comprise fewer bits than tokens 106.

Among the costs of achieving the aforementioned space savings is the overhead of maintaining one or more mappings between tokens and codes and/or vice versa. Collectively, the one or more mappings are hereinafter referred to as a "dictionary". A dictionary can be used to compress and/or decompress database data. For example, dictionary 104 can be used to compress the token "Alexis" into the code "1" and/or to decompress the code "1" into the token "Alexis". Thus, a dictionary is typically maintained in relatively fast but small memory along with the compressed data with which it is associated. As used herein, a dictionary is said to be "for" or "associated with" database data if the dictionary is to be used for compressing and/or decompressing the database data.

For the sake of clarity and ease of explanation, FIG. 1 abstractly depicts dictionary 104 as a single structure that is separate from columns 100-102. However, in reality, dictionary 104 may be implemented as at least two separate structures—an encoding dictionary and a decoding dictionary. An encoding dictionary maps tokens to codes and may be implemented as a hash table, for example. In contrast, a decoding dictionary maps codes to tokens and may be implemented as an array of distinct tokens, for example. One reason why a dictionary may be implemented as two separate structures is that some structures enable faster lookups than other structures. For example, an array enables faster lookups than a hash table.

Token-Ordered Dictionaries

Typically, dictionaries have entries that are maintained in a code order. This is because dictionary codes are often used as indexes into the dictionary entries. However, some dictionaries also maintain tokens in a token order with the order of the codes mirroring the order of the respective tokens. Such dictionaries are hereinafter referred to as "token-ordered dictionaries". Advantageously, token-ordered dictionaries can be used to efficiently evaluate "range queries". As used herein, a range query specifies an upper boundary and/or a lower boundary for a set of one or more values.

An example range query is "SELECT*FROM table WHERE token column>='Chris' AND token column<'Peyton'. Dictionary 104 is a token-ordered dictionary that enables the example range query to be efficiently evaluated over code column 102, which is the compressed representation of token column 100. According to dictionary 104, the query predicate is satisfied by any code that is greater than or equal to "2" but less than "4". Thus, column 102 may be scanned for the codes "2" and "3".

However, it is difficult to maintain a token-ordered dictionary when underlying database data is updated. For example, the token "Devin" may be added to column 100, thereby necessitating an update of dictionary 104. Appending the token-to-code entry "Devin: 6" to dictionary 104 would cause tokens 106 to become unordered. On the other hand, inserting "Devin: 6" between the entries "Chris: 2" and "Jesse: 3" would cause codes 108 to become unordered. Thus, updating a token-ordered dictionary often involves rebuilding the dictionary, such as by copying the dictionary into a separately allocated structure where it can be re-sorted.

Global Dictionaries

Some dictionaries are consolidated or system-level dictionaries in that a single dictionary can be used to compress and/or decompress an entire column of a database table. Such a dictionary is hereinafter referred to as a "global dictionary". For example, a column of a database table may be divided into chunks of 16 KB each, but all the chunks may share the same global dictionary. In other words, mappings between tokens and codes do not vary from chunk to chunk. As another example, a database table may be partitioned into shards of 16 GB each, and to spread load, each shard may be stored on a separate node of a "shared nothing" cluster; however, all the nodes may share the same global dictionary for a particular column. In other words, mappings between tokens and codes do not vary from node to node or shard to shard.

However, a global dictionary is typically large enough that rebuilding it can adversely affect system performance. Not only can dictionary rebuilding unnecessarily consume precious space in memory, but it can also be a computationally intensive process that involves periodically taking the database system offline. Furthermore, updates to the underlying database data can cause a dictionary to become "stale" or contain incorrect entries. A stale dictionary can cause the database system to underperform until the dictionary can be rebuilt, which may not be scheduled to occur for a prolonged period of time.

Updating a dictionary often necessitates updating one or more codes in a column. For example, updating dictionary 104 with the updated entry "Jesse: 4" would necessitate updating column 102 to replace all instances of the code "3" with the code "4". Notably, updating column 102 involves knowledge of the un-updated entry "Jesse: 3".

This can be problematic in a distributed database system, because only encoded values are typically passed to the nodes in order to conserve memory. Thus, the nodes are only aware of the original encoded values, not the original uncompressed values of the database data. After a global dictionary is updated, the encoded values stored on the nodes become invalid, but the nodes lack sufficient information to update the encodings themselves. Accordingly, a relatively large amount of data comprising updated encodings is typically propagated to the nodes, thereby significantly taxing network resources.

Therefore, what is needed is an approach for maintaining a token-ordered dictionary that can be updated without taking the database system offline and without adversely affecting performance.

Figure 1:
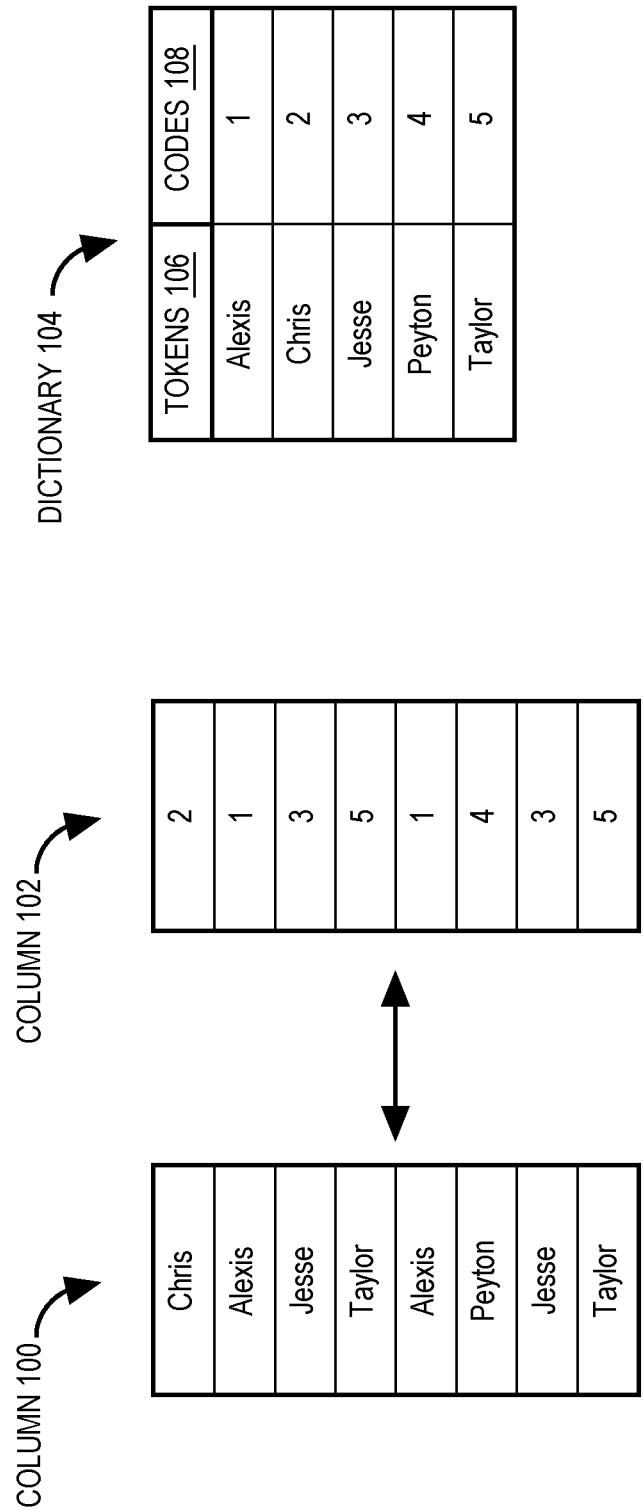
FIG. 1 depicts an example approach for dictionary compression.

While each of the drawing figures depicts a particular embodiment for purposes of depicting a clear example, other embodiments may omit, add to, reorder, and/or modify any of the elements shown in the drawing figures. For purposes of depicting clear examples, one or more figures may be described with reference to one or more other figures, but using the particular arrangement depicted in the one or more other figures is not required in other embodiments.

DETAILED DESCRIPTION

In the following description, for the purposes of explanation, numerous specific details are set forth in order to provide a thorough understanding of the present disclosure. It will be apparent, however, that the present disclosure may be practiced without these specific details. In other instances, well-known structures and devices are shown in block diagram form in order to avoid unnecessarily obscuring the present disclosure. Modifiers such as "first" and "second" are used to differentiate elements and do not necessarily indicate any particular order.

Introduction

Described herein are techniques for updating a token-ordered dictionary without taking the database system offline and without adversely affecting performance. In some embodiments, the token-ordered dictionary is a global dictionary that includes a "sparse tree". A sparse tree can be any tree data structure that stores "sparse dictionary codes". Sparse dictionary codes are characterized by a gap between a pair of mapped codes.

Figure 2:
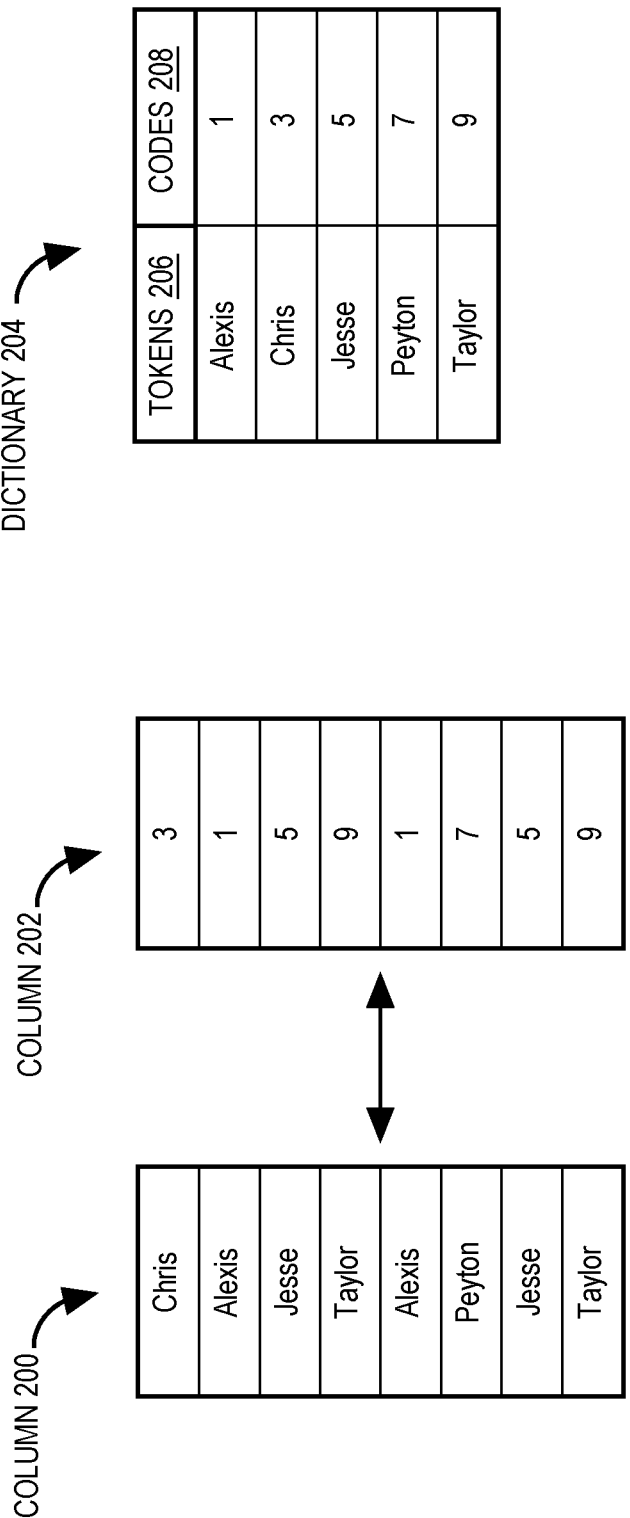
FIG. 2 depicts an example approach for dictionary compression based on a sparse dictionary.

Assume, for the sake of illustration, that dictionary codes are selected from the domain of positive integers. Referring to FIG. 1, codes 108 are "dense", not sparse, because there are no gaps between the consecutive integers. Turning now to FIG. 2, codes 208 are sparse, because even integers can be inserted into the gaps between the odd integers.

Advantageously, a sparse tree can be efficiently updated at runtime. In other words, after a dictionary is generated, the dictionary can be updated without taking the database system offline. This is because the code gaps enable minimizing the amount of data that is changed, and the tree structure enables modifying the dictionary without rebuilding it.

For example, updating dictionary 204 with the new token "Devin" involves mapping "Devin" to the new code "4" and inserting, between "Chris: 3" and "Jesse: 5", the new entry that maps "Devin" to the new code "4". This can be performed without affecting any existing entries based on inserting a new node into a tree structure.

Generating a Sparse Dictionary

When a database table is loaded into a database system, a "sparse dictionary" can be generated for the database table. Referring to FIG. 2, dictionary 204 is a sparse dictionary, because it has sparse dictionary codes. For the sake of clarity and ease of explanation, FIG. 2 depicts an abstraction of a sparse dictionary as a single structure. In reality, however, dictionary 204 may be implemented as two separate structures—an encoding dictionary and a decoding dictionary. Encoding dictionaries and decoding dictionaries are described in greater detail below.

Dictionary 204 comprises one or more entries that map codes 208 to tokens 206, each entry mapping a code in codes 208 to a token in tokens 206. Notably, codes 208 consist of odd integers. Thus, codes 208 are sparse over the domain of positive integers, because they are non-consecutive integers. Accordingly, even integers can be inserted into the gaps between the odd integers. For the sake of clarity and ease of explanation, FIG. 2 depicts a toy example of a sparse dictionary. In reality, the size of the gaps between mapped dictionary codes can be quite large.

In some embodiments, gap size may be determined based on dividing the domain of the dictionary codes by the cardinality of the tokens to be encoded. More specifically, the number of unmapped dictionary codes in a gap may be determined according to the formula "(number of possible codes—number of distinct tokens)/(number of distinct tokens)".

For example, suppose that codes 208 are to have a fixed width of thirty-two bits. A suitable data type for codes 208 would be unsigned-byte-4 (ub4), which has possible values in the range of zero to 4,294,967,295. This range of possible values is the domain of codes 208, which can have $2^{32}$ or 4,294,967,296 unique values.

Continuing with this example, tokens 206 consist of five distinct values, so the cardinality of tokens 206 is five. Subtracting five from 4,294,967,296 and dividing the result by five yields gaps that each have at least 858,993,458 unmapped codes. Thus, dictionary 204 may have the following entries: "Alexis: 0", "Chris: 858,993,459", "Jesse: 1,717,986,918", "Peyton: 2,576,980,377", and "Taylor: 3,435,973,836".

In some embodiments, a sparse dictionary is also a token-ordered dictionary, because maintained therein are dictionary entries that map ordered codes to ordered tokens. An example process of generating a token-ordered dictionary may involve (1) gathering unordered tokens when a database table is loaded, (2) uniquely assigning unordered codes to the unordered tokens, (3) sorting the tokens, and (4) re-mapping the tokens to ordered codes.

Notably, performance of (3) and (4) may be deferred for various reasons. For example, deferring performance of (3) and (4) enables avoiding the overhead of sorting unless it is known that ordered tokens are needed, such as when range queries are detected. As another example, performance of (3) and (4) may be deferred to enable sorting to be performed in parallel in a distributed database environment.

In some embodiments, a sparse dictionary is also a global dictionary in that it can be associated with all subsets of a particular column of a database table. For example, a sparse global dictionary can be shared across all nodes of a distributed database system. As will be described in greater detail below, updating a sparse global dictionary can be performed more efficiently than updating a dense global dictionary, particularly in a distributed database environment.

Updating a Sparse Dictionary

Figure 3:
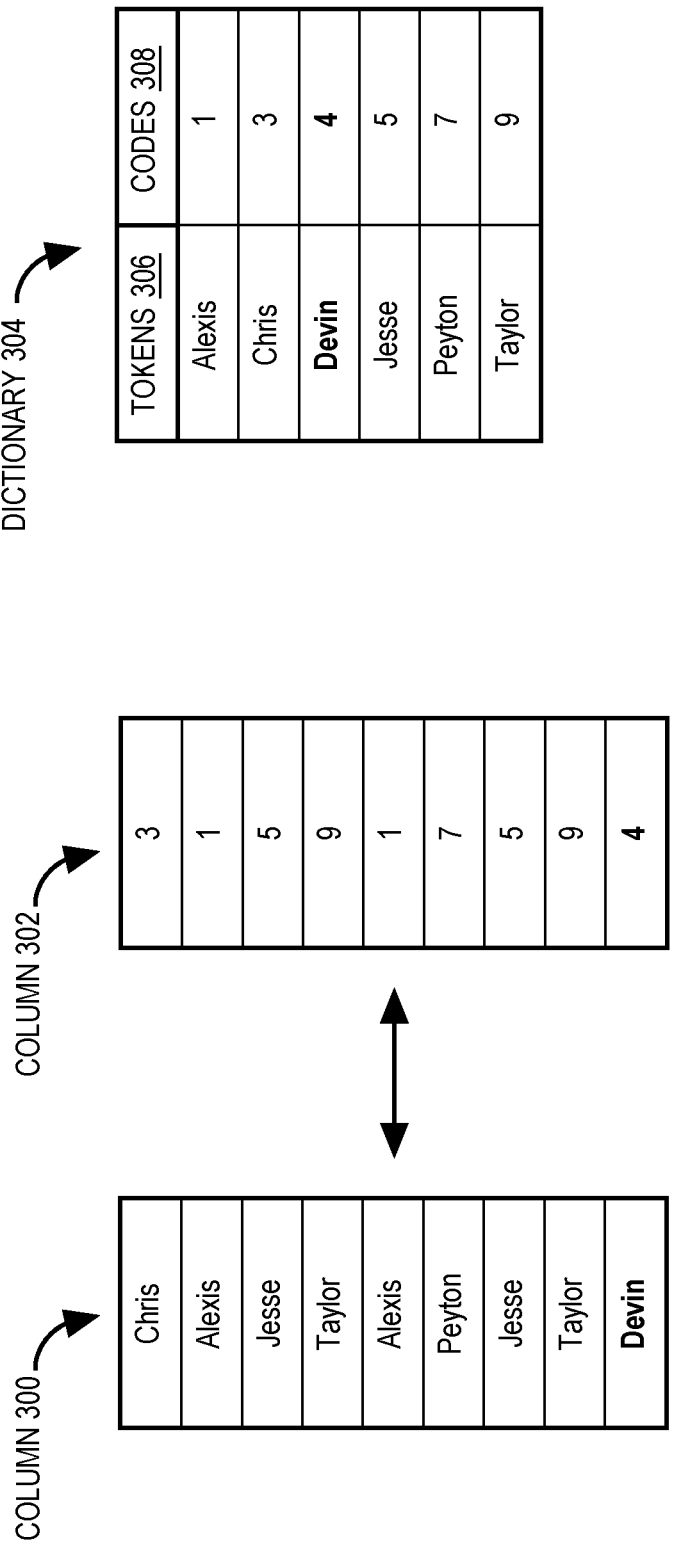
FIG. 3 depicts an example approach for inserting a code into a gap existing in the sparse dictionary.

Advantageously, a sparse dictionary can be efficiently updated at runtime based on inserting a new entry into a code gap. Referring to FIG. 3, the new token "Devin" is appended to column 200 to generate column 300. Dictionary 304 is an updated version of dictionary 204 in that dictionary 304 includes the new entry "Devin: 4". Based on the new entry, the code "4" is appended to column 202 to generate column 302.

The new entry is inserted between the entries "Chris: 3" and "Jesse: 5", because there is a gap between the codes "3" and "5". An example dictionary update process may involve (1) searching for the new token "Devin" in dictionary 204; (2) receiving the unmapped code "4" as a search result; (3) based on receiving the unmapped code, determining that "Devin" is not included in dictionary 204; (4) determining that "Devin" is to be mapped to "4"; and (5) inserting the new entry "Devin: 4" between "Chris: 3" and "Jesse: 5" to generate dictionary 304.

Notably, the rest of dictionary 304 remains unaffected. This is particularly beneficial in a distributed database system, because updating dictionary 304 in this manner enables a relatively small amount of data to be propagated to the nodes.

In some embodiments, the unmapped code that is returned in (2) is selected from a plurality of unmapped codes based on a predetermined formula. For example, the predetermined formula may resemble a floor or ceiling function applied to an average of two mapped codes. Thus, the unmapped code that is selected may be an intermediate code that is approximately halfway between the two mapped codes.

As mentioned above, a sparse dictionary can be updated without affecting any existing entries, but this is not always the case. For example, when a gap becomes full, inserting a new entry into the gap involves re-encoding some of the existing entries. However, sparse codes can limit the re-encoding to the existing entries of the gap.

Figure 4:
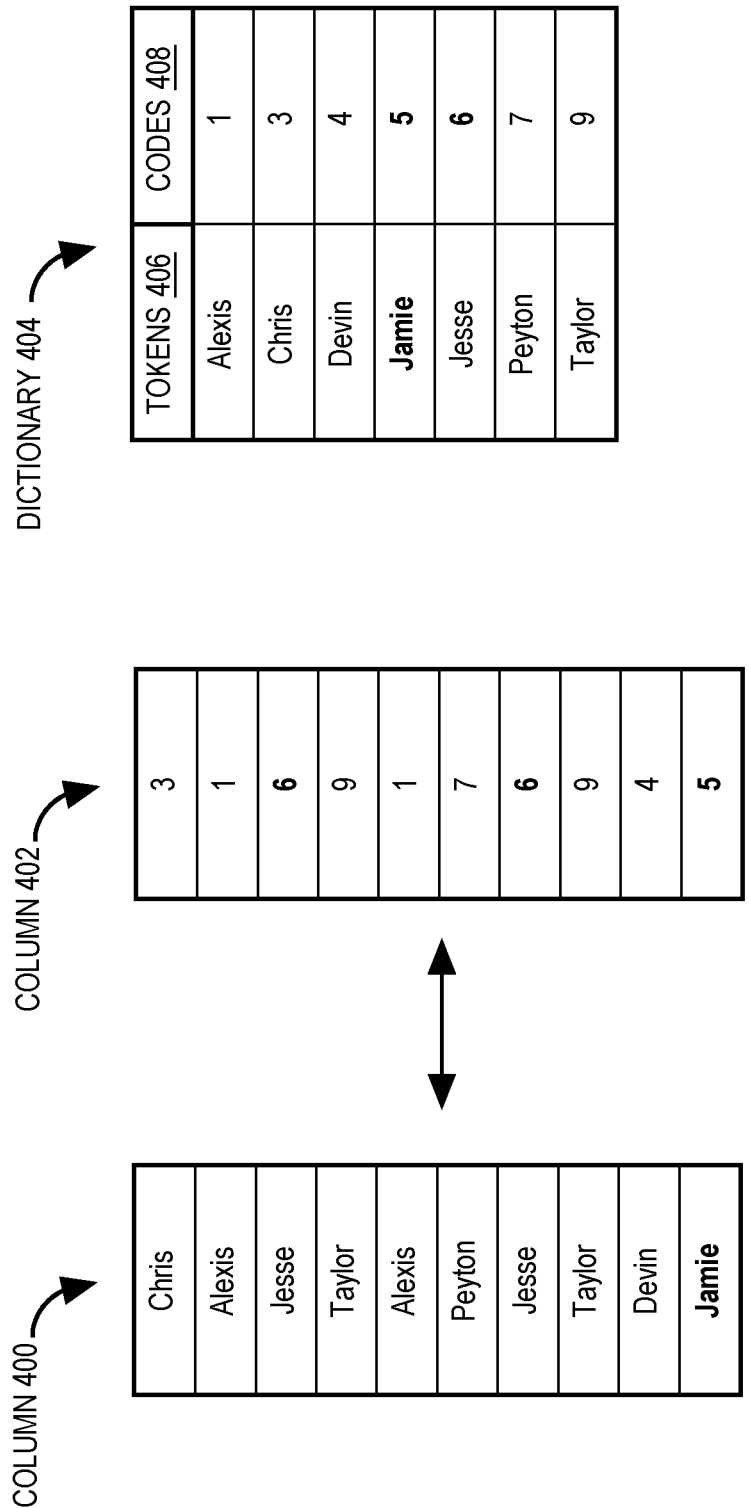
FIG. 4 depicts an example approach for inserting a code into a gap created in the sparse dictionary.

Referring to FIG. 4, the new token "Jamie" is appended to column 300 to generate column 400. Dictionary 404 is an updated version of dictionary 304 in that dictionary 404 includes the new entry "Jamie: 5" and the re-encoded entry "Jesse: 6". Based on dictionary 404, column 402 is generated based on appending the code "5" to column 302 and replacing all other instances of the code "5" with the code "6".

Notably, the scenario depicted in FIG. 4 involves inserting a new token into a code gap that is full. To accommodate the new token "Jamie", the existing token "Jesse" is effectively shifted or moved into an adjacent gap.

In the scenario of FIG. 4, one or more existing tokens are shifted down, but in some scenarios, one or more existing tokens may be shifted up. For example, the new token "Jamie" could have been mapped to the code "4", thereby causing "Chris" and "Devin" to be mapped to "2" and "3", respectively.

Whether one or more existing tokens are shifted up or down may depend on any of a variety of criteria. Example criteria include how much re-encoding would be necessary, whether the previous gap is larger or smaller than the subsequent gap, and/or the like. For example, in the scenario of FIG. 4, "Jesse" was shifted down, because it was more efficient than shifting both "Chris" and "Devin" up.

In some scenarios, one or more existing tokens may be shifted up and one or more other existing tokens may be shifted down. Shifting existing tokens in both directions is hereinafter referred to as "expanding" a full/sparse gap. The following is an example of a dictionary having a sparse gap that will be expanded:

| Pre-Expansion Dictionary | |
|---|---|
| Token | Code |
| A | 1 |
| B | 6 |
| C | 8 |
| D | 13 |

Notably, the gap between the codes "6" and "8" is sparse, but the gap is expanded to yield the following dictionary:

| Post-Expansion Dictionary | |
|---|---|
| Token | Code |
| A | 1 |
| B | 5 |
| C | 9 |
| D | 13 |

Notably, the entries for "A" and "D" remain unaffected. However, the size of the gap between "B" and "C" is expanded by shifting "B" up while shifting "C" down.

A determination to expand a full/sparse gap may be based on any of a variety of criteria. For example, the determination may be made when the size of the gap falls below a predetermined threshold that is computed based on dividing the size of the gap by the number of distinct tokens. Additionally or alternatively, the determination may be made when shifting up would be just as efficient as shifting down.

For the sake of clarity and ease of explanation, the examples above involve only a handful of codes. In reality, however, re-encoding may involve changing thousands or millions of codes. Thus, re-encoding can still have a significant impact on performance even if fewer codes are changed using the aforementioned techniques.

In some embodiments, to make it practically unnecessary to re-encode any entries, codes are implemented as decimal numbers that resemble version numbers. Such codes are hereinafter referred to as "versioned codes".

For example, the original tokens "A" and "B" may be represented by the codes "1.0" and "2.0", respectively. Inserting the new token "AB" between "A" and "B" may involve mapping "AB" to the code "1.1". Thereafter, inserting the new token "AA" between "A" and "AB" may involve mapping "AA" to the code "1.01".

Notably, the digits preceding the decimal point may be used to distinguish the original tokens determined at load time. Each new token may be distinguished from the original tokens and from other new tokens by modifying one or more digits that follow the decimal point.

As mentioned above, re-encoding would become optional. However, re-encoding may be performed to compact codes that can be represented using a smaller number of bits. Such codes are likely to be prevalent, because versioned codes have variable sizes, which can result in under-allocating or over-allocating bits for codes.

In some embodiments, a fixed width is specified for versioned codes. As in the previous example, a set of original tokens determined at load time may be distinguished based on the digits preceding the decimal point. The number of bits necessary to represent these digits can be a fixed number that is determined at load time. Furthermore, new tokens may be distinguished from the original tokens and from other new tokens by modifying one or more digits that follow the decimal point. The number of bits necessary to represent these digits can be predetermined.

For example, the digits that follow the decimal point may be limited to representation by thirty-two bits. Thus, if the original tokens "A" and "B" are represented by the codes "1.0" and "2.0", respectively, then inserting the new token "AB" between "A" and "B" may involve mapping "AB" to the code "1.2147483648", which is "1.0" plus $2^{31}$. Thereafter, inserting the new token "AA" between "A" and "AB" may involve mapping "AA" to the code "1.1073741824", which is "1.0" plus $2^{30}$. Notably, "1.1073741824" is halfway between "1.0" and "1.2147483648".

Although such embodiments do not make it completely unnecessary to re-encode any entries, they do enable infrequent re-encodings. In the example above, re-encoding would be necessary after thirty-two new tokens are inserted between "A" and "B". Furthermore, re-encoding may be performed to compact codes that can be represented using a smaller number of bits.

Implementing fixed-width versioned codes may involve a decoding dictionary comprising multiple structures. For example, an array may store the digits preceding the decimal point, and a hash table may store the digits that follow the decimal point.

In some embodiments, codes are represented as floating-point numbers. However, it may be difficult to determine an intermediate code based on averaging two floating-point numbers. For example, the sum may exceed the upper bound of the float data type.

In some embodiments, a locking protocol enables concurrent reads and updates. For example, a latching mechanism may prevent reading an entry while it is being updated but enable reading other entries that are not being updated.

Encoding Dictionary

Figure 5:
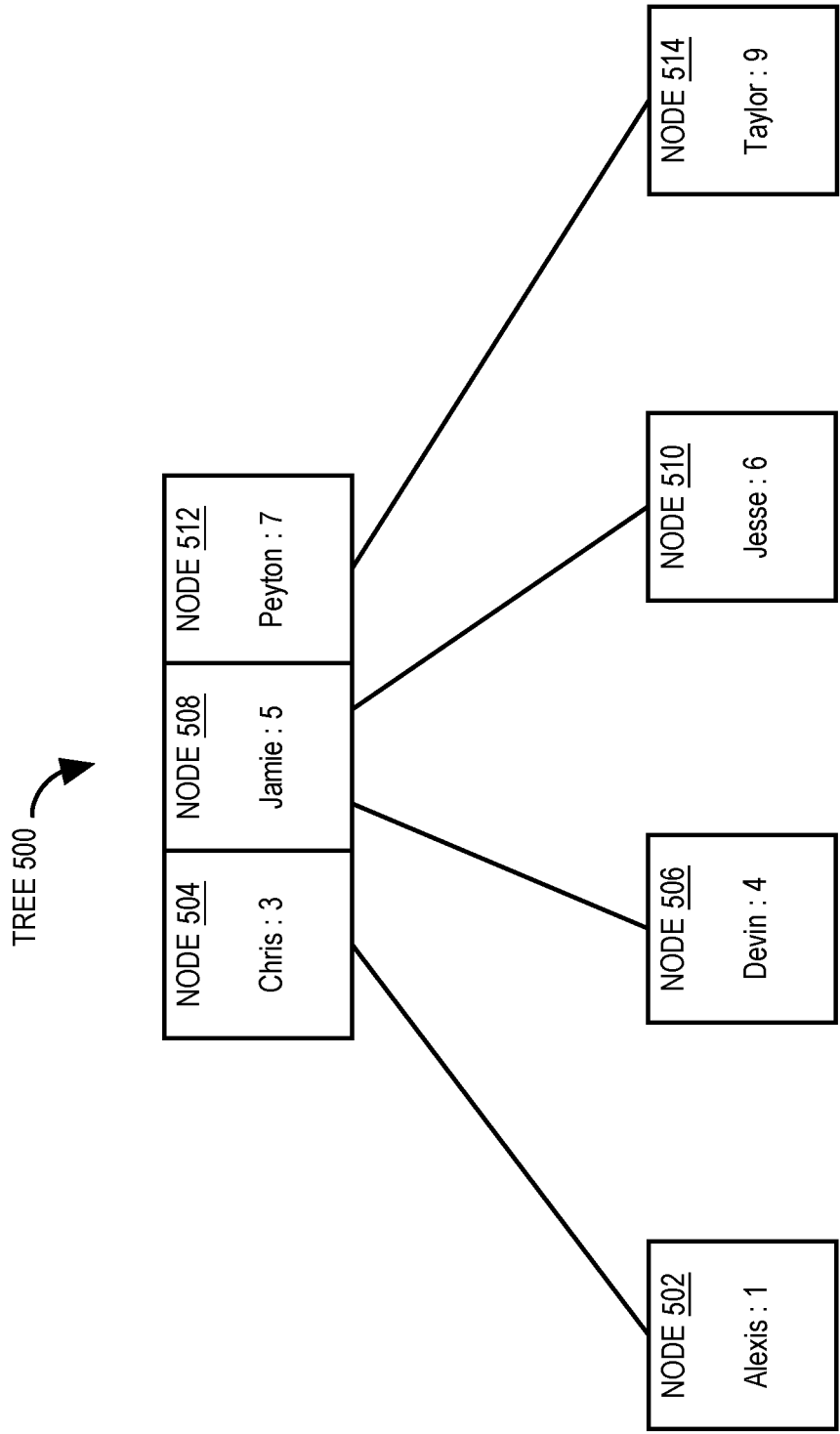
FIG. 5 depicts an example sparse dictionary tree.

As mentioned above, an encoding dictionary of dictionaries 204, 304, and/or 404 may be implemented as a tree structure. Example tree structures include a B tree, a B+ tree, a radix tree, a trie, a 2-3-4 tree, and/or the like. Referring to FIG. 5, sparse dictionary tree 500 is a 2-3-4 tree having nodes 502-514. Each node includes data that maps a token to a code. Adjacent nodes can be determined by the node labels. For example, node 504 is adjacent to node 506, not node 508.

Tree 500 is a token-ordered tree that stores the updated encoding dictionary of dictionary 404. When tree 500 stored the encoding dictionary of dictionary 204, node 504 was adjacent to node 510.

When tree 500 stored the updated encoding dictionary of dictionary 304, node 506 was inserted between node 504 and node 510. Notably, the code "4" of node 506 was greater than the code "3" of node 504 but less than the former code "5" of node 510.

When tree 500 was updated to include the entry "Jamie: 5", node 508 was inserted between node 506 and node 510. Prior to the update, nodes 506 and 510 corresponded to the consecutive codes "4" and "5", respectively. However, during the update, node 510 was re-encoded to correspond to the code "6", thereby making space for the code "5" of node 508.

A tree structure offers a number of advantages over other structures, such as arrays or vectors, that can be used to implement a dictionary. These advantages include a more efficient use of memory as well as faster lookups.

As mentioned above, a tree structure makes dictionary rebuilding unnecessary. For example, inserting a new node in a tree may involve modifying the pointers of existing nodes, whereas inserting a new element in an array may involve allocating a separate array and copying old elements into it. Even a sparse array is inferior to a sparse tree, because the sparse array may allocate unused memory and may have to be rebuilt when a gap is full.

Furthermore, a tree structure enables faster lookups. For example, a binary search may have to be performed on an array. This has an algorithmic complexity of $O(\log_{2n})$. In contrast, a tree lookup in a 2-3-4 tree has an algorithmic complexity of $O(\log_{4n})$.

Decoding Dictionary

As mentioned above, dictionaries 204, 304, and/or 404 may also be implemented using a decoding dictionary. The decoding dictionary can be used at query time to evaluate a query over a column of compressed values. The decoding dictionary may be implemented using any of a variety of structures, such as a hash table, an array/vector, a list, or a tree structure.

Figure 6:
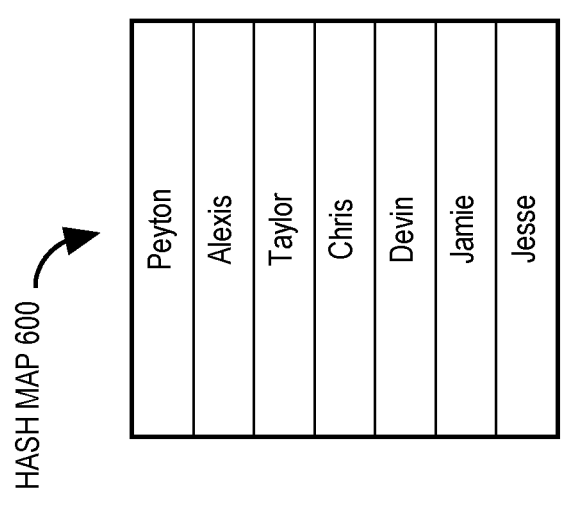
FIG. 6 depicts an example decoding dictionary.

Referring to FIG. 6, hash map 600 is used to implement a decoding dictionary. Each element of hash map 600 corresponds to a respective hash bucket that contains one or more tokens. For example, the first bucket stores "Peyton", the second bucket stores "Alexis", and so forth. Each bucket has a respective index value (not shown). For example, the first bucket has an index value of "0", the second bucket has an index value of "1", and so forth.

A hash function can be applied to a code to determine which bucket contains a token corresponding to the code. For example, a hash function can be applied to the code "7" to determine that "7" maps to the first bucket, which stores the token "Peyton". Any of a variety of functions can be used as the hash function. For the sake of clarity and ease of explanation, assume that the hash function used with hash map 600 is a simple modulo operation in which the modulus is seven. For example, dividing the code "7" by the modulus seven yields a remainder of zero, which is the index value of the first bucket; dividing the code "1" by the modulus seven yields a remainder of one, which is the index value of the second bucket; and so forth.

When an encoding dictionary is updated, a corresponding decoding dictionary can also be updated. Updating a decoding dictionary based on inserting a new token typically involves rebuilding the decoding dictionary. Advantageously, a hash map can tolerate collisions, so rebuilding the hash map can be deferred. In some embodiments, a hash map is rebuilt when a threshold number of codes has been reached. For example, when the number of codes is 1.5 times the number of elements in the hash map, the size of the hash map may be doubled.

Furthermore, rebuilding a hash map can be performed at runtime. It may be unnecessary to take the database system offline, because the hash map can be rebuilt very quickly. For example, doubling the size of a hash map can be performed very quickly based on parallelization and without blocking. The size of the hash map can be doubled based on using a different modulus, which determines the size of the hash map. Thus, a token that was stored in the first bucket of the old hash map may be stored in the new hash map in either the first bucket or the (n+1)th bucket, where n is the size of the old hash map.

In contrast, implementing a decoding dictionary as an array/vector enables faster lookups with less computational overhead. In a decoding dictionary implemented as an array/vector, the nth element corresponds to the token mapped to the code n. An example array is provided below.

| Decoding Array | | | | | | |
|---|---|---|---|---|---|---|
| Alexis | Chris | Devin | Jamie | Jesse | Peyton | Taylor |

For example, "Alexis" is the first element, because it is mapped to the code "1"; "Chris" is the third element, because it is mapped to the code "3"; and so forth. Notably, two elements are empty, so this is a sparse array.

As mentioned above, however, an array/vector implementation suffers from a number of drawbacks. A sparse array/vector makes inefficient use of memory, because a relatively large array/vector is typically allocated to account for code gaps. Furthermore, an array/vector is typically rebuilt whenever there is an update. This may involve taking the database system offline.

In further contrast, implementing a decoding dictionary as a tree structure can avoid any rebuilding although some entries may be re-encoded from time to time. However, it may be slower to perform a lookup in a tree structure than in an array/vector or a hash map.

In some embodiments, a tree structure has a two-way index that enables it to serve as both an encoding dictionary and a decoding dictionary. For example, each node of tree 500 may also include a code-to-token entry.

Garbage Collection

To conserve memory, unused tokens and/or codes may be deleted from an encoding dictionary and/or a decoding dictionary in a process hereinafter referred to as "garbage collection". Any of a variety of approaches for performing garbage collection may be implemented. Example approaches include reference counting, mark-and-sweep, and/or the like.

Some embodiments employ reference counting for performing garbage collection. Reference counting is a technique that involves maintaining reference counters that store the number of references to a token and/or a code. As used herein, a reference can be a pointer, handle, and/or the like. For example, a reference counter may be stored with each dictionary token to track the number of references to it.

A reference counter that reaches zero indicates that the token and/or the code associated with the reference counter is no longer in use and can be deleted. For example, if node 514 has a reference counter that reaches zero, node 514 can be deleted from tree 500, thereby returning the code "9" to the pool of available codes.

Some embodiments employ a mark-and-sweep approach for garbage collection. Mark-and-sweep is a technique that involves periodically scanning a column of a database table for tokens and/or codes that are in use and marking them as such in a dictionary. Thereafter, any unmarked tokens and/or codes can be deleted from the dictionary.

For example, a first thread may scan column 400 for dictionary tokens that are in use. All nodes of tree 500 that correspond to the dictionary tokens in use may be marked as such based on setting a bit flag. Thereafter, a second thread may delete any nodes of tree 500 having an unset bit flag, thereby returning the codes of the deleted nodes to the pool of available codes.

In some embodiments, the mark-and-sweep approach uses a prioritized scanning technique. Prioritized scanning may involve multiple iterations of scanning a column. Earlier iterations may scan for tokens and/or codes in the relatively dense portions of a dictionary, and later iterations may scan for tokens and/or codes in the relatively sparse portions of the dictionary. In this manner, freeing unused tokens and/or codes in the relatively dense portions of the dictionary is expedited to reduce the risk of having to perform a computationally intensive re-encoding process.

Compared to the reference counting approach, the mark-and-sweep approach uses less memory per token/code. For example, a bit flag may be significantly smaller than a reference counter, which can be multiple bits.

However, the mark-and-sweep approach involves scanning an entire column of a database table. As mentioned above, the entire column may be scanned multiple times in some embodiments.

Process Overview

Figure 7:
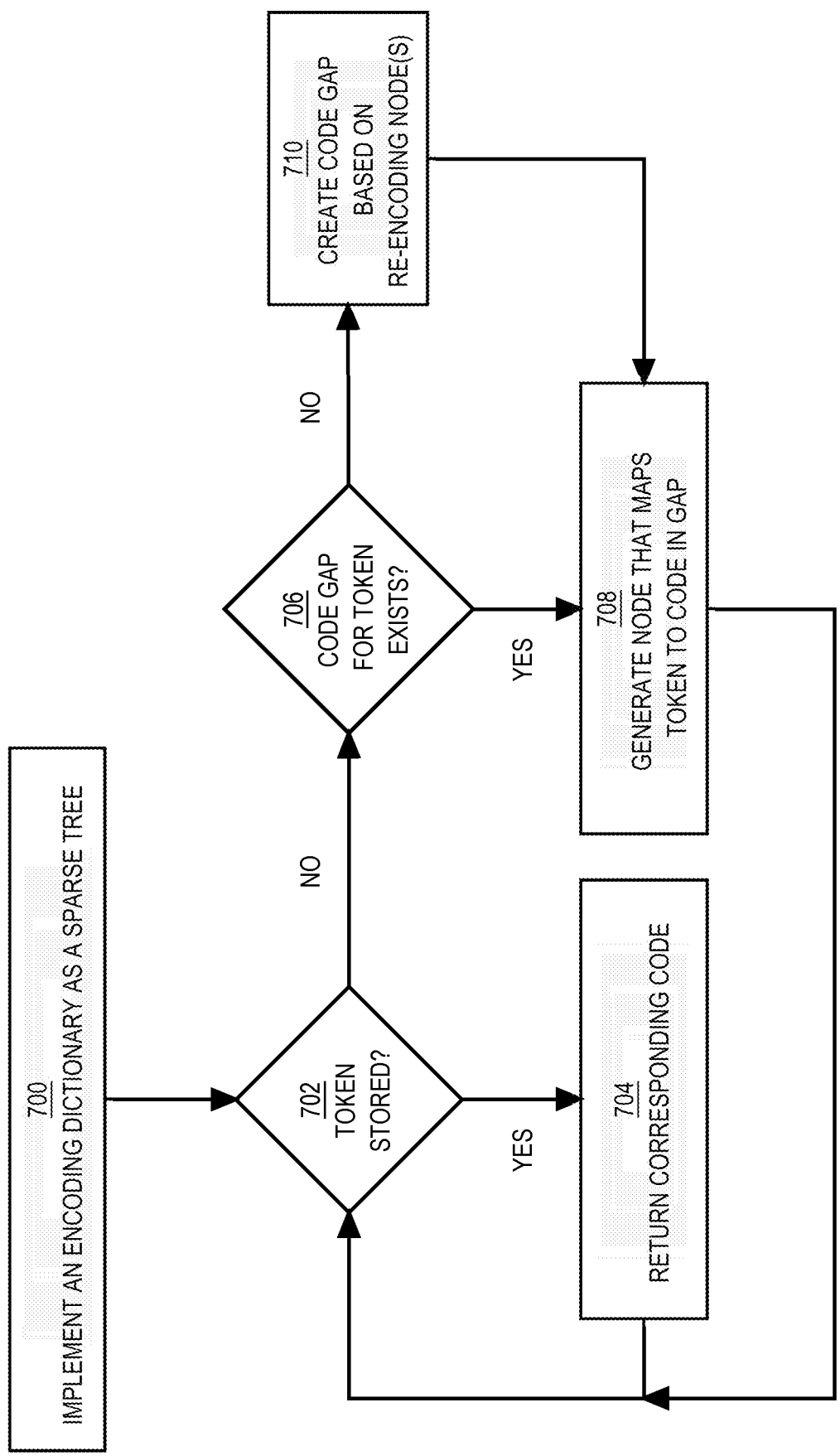
FIG. 7 is a flow diagram that depicts example operations involving a sparse dictionary tree.

Referring to FIG. 7, example operations involving a sparse dictionary tree are depicted. Blocks 700-704 may be performed when a database table is loaded into a database system. To update the sparse dictionary tree, blocks 706-710 may be performed while the database system is online.

At block 700, an encoding dictionary is implemented as a sparse tree. The sparse tree comprises a plurality of nodes that map a plurality of ordered tokens to a plurality of ordered codes. Each node corresponds to a respective code in that each node contains a unique token-to-code entry. However, adjacent nodes correspond to non-consecutive codes in the domain of the codes. In other words, there are code gaps between adjacent nodes.

At block 702, a determination is made as to whether a particular token is stored in the sparse tree. For example, block 702 may be performed to compress a column of tokens into a column of codes. If the particular token is found in the sparse tree, block 702 proceeds to block 704. Otherwise, block 702 proceeds to block 706.

At block 704, the code that is mapped to the particular token is returned. Block 704 may proceed to block 702 to determine whether another token is stored in the sparse tree.

By block 706, it has been determined that the particular token is not stored in the sparse tree. For example, a database table may have been modified after load time to include the particular token. Accordingly, a dictionary update process may commence at block 706. More specifically, at block 706, a determination is made as to whether the sparse tree has a code gap where the particular token would have been found. If so, block 706 proceeds to block 708. Otherwise, block 706 proceeds to block 710.

At block 708, a new node is generated to include an entry between the particular token and a new code. The new code may be an intermediate code having a value that is approximately halfway between the values of the codes that demarcate the code gap. The new node is logically inserted into the code gap between a pair of adjacent nodes. For example, this may be performed based on modifying a set of pointers stored in the adjacent nodes. Block 708 may proceed to block 702 to determine whether another token is stored in the sparse tree.

At block 710, since a code gap does not exist where the particular token would have been found, a code gap is logically created there. This is performed based on re-encoding one or more nodes. Block 710 may proceed to block 708 to generate a new node to be inserted into the newly created code gap.

Other Approaches

Various other approaches may be used for updating a token-ordered dictionary to account for updates to database data. A discussion of some of these approaches is provided below.

Local Dictionaries

Some approaches involve maintaining dictionaries in relatively small and easily manageable sizes. Such dictionaries are hereinafter referred to as "local dictionaries". A local dictionary may be associated with less than all values of a column of a database table. For example, a column of a database table may be divided into chunks of 16 KB each, and each chunk may have its own local dictionary. As another example, a database table may be partitioned into shards of 16 GB each, and to spread load, each shard may be stored on a separate node of a "shared nothing" cluster; thus, each node may have its own local dictionary, which is associated with a column of a particular shard.

Local dictionaries offer the benefit of being sufficiently small as to enable rebuilding them relatively quickly and with little, if any, downtime. For example, inserting "Devin: 6" into the toy dictionary of FIG. 1 would involve re-sorting a mere handful of tokens and/or codes. This can be performed relatively quickly while the database system remains online, for example, using a locking protocol. Accordingly, updating a local dictionary can be performed whenever the local dictionary becomes stale, thereby avoiding any system underperformance caused by delayed updates.

However, maintaining local dictionaries can increase computational overhead when performing certain operations, such as a JOIN operation, a GROUP BY operation, and/or any other operation involving multiple portions of a database table. For example, on a first node of a distributed database system, the token "Alexis" may map to the code "1", but on a second node, the token "Alexis" may map to the code "2"; thus, it may be necessary for one of the nodes to perform a computationally intensive re-map operation before a JOIN operation can be performed.

Global Dictionary with Delta Dictionaries

Some approaches involve separately maintaining dictionary updates in one or more structures hereinafter referred to as one or more "delta dictionaries". Conceptually, maintaining one or more delta dictionaries is much like maintaining multiple versions of the global dictionary.

In some embodiments, codes that have been affected by updates are marked as such, and each delta dictionary corresponds to a different updated code. Thus, each delta dictionary stores a set of one or more tokens that map to a particular code in one or more different versions of the global dictionary. For example, a delta dictionary for the code "5" may store the tokens "Peyton" and "Jesse", thereby indicating that "Peyton" is mapped to the code "5" in version 2 of the global dictionary and that "Jesse" mapped to the code "5" in version 3.

In some embodiments, version 1 may be the original global dictionary; version 2 may comprise the original global dictionary and a first delta dictionary; version 3 may comprise the original global dictionary, the first delta dictionary, and a second delta dictionary; and so forth. For example, version 1 may comprise the entries of dictionary 104; the first delta dictionary may comprise the entries ""Devin: 3", "Jesse: 4", "Peyton: 5", and "Taylor: 6"; and the second delta dictionary may comprise the entries "Jamie: 4", "Jesse: 5", "Peyton: 6", and "Taylor: 7".

However the delta dictionaries are implemented, they enable immediately updating the global dictionary to avoid prolonged staleness. In effect, the rebuilding process is separated from the updating process so that the rebuilding process can be deferred until a time that is convenient. Typically, the database system is taken offline periodically to rebuild the global dictionary based on merging a batch of delta dictionaries.

Although maintaining delta dictionaries addresses the problem of prolonged staleness, query processing may involve successive lookups in multiple versions of a dictionary, thereby increasing computational overhead involved in encoding and/or decoding. For example, query processing may involve re-tracing a series of updates to determine both (1) which codes are mapped to the tokens in the query predicate and (2) which tokens are mapped to the codes in the query result.

Table Dictionaries

Some approaches involve maintaining a dictionary as a relational table that resembles the abstraction of dictionary 104. Such a dictionary is hereinafter referred to as a "table dictionary".

A table dictionary does not maintain codes in order. An example table dictionary is provided below:

| Table Dictionary | |
| --- | --- |
| Token | Code |
| A | 9 |
| C | 3 |
| D | 5 |
| B | 42 |

Notably, the table dictionary has been updated based on appending the entry "B: 42". Advantageously, it is unnecessary to rebuild the table dictionary.

Although a table dictionary includes unordered codes, it can still support range queries based on ordered tokens. In the example above, the tokens are still considered ordered, because the appended entry can be treated like a delta dictionary.

For example, a range query may include the predicate "WHERE Name>'C'". Evaluating this predicate over the table dictionary above would effectively filter out all the entries except "D:5".

It is unnecessary to maintain ordered codes, because the codes serve as little more than JOIN keys during query evaluation. More specifically, the unordered codes are used to perform a JOIN operation between a filtered set of one or more entries, such as the one mentioned above, and a column of encoded values. Provided below is an example of a database table that includes a column of encoded values.

| Encoded Table | |
| --- | --- |
| Id | Name |
| 0 | 3 |
| 1 | 9 |
| 2 | 5 |
| 3 | 9 |
| 4 | 3 |
| 5 | 5 |
| 6 | 3 |
| 7 | 9 |
| 8 | 42 |

Notably, the encoded values are much like foreign keys that can be used to join the encoded table with one or more entries of the table dictionary. The following JOIN table can be returned as the query result.

| Join Table | |
| --- | --- |
| Id | Token |
| 2 | D |
| 5 | D |

However, using a table dictionary to evaluate a query involves rewriting the query. In the example above, the query "SELECT*FROM Encoded Table WHERE Name>'D'" is rewritten to "SELECT Id, Token FROM Encoded Table, Table Dictionary WHERE Name=Code AND Token>'D'". Notably, rewriting queries adds to computational overhead, and the increase in computational overhead can be quite significant if there are a large number of encoded columns in a database table.

Furthermore, maintaining table dictionaries is a relatively inefficient use of memory. This is because table dictionaries are materialized in a relatively large database table format. In contrast, the other types of dictionaries mentioned above have relatively compact formats, such as trees, hash tables, or arrays, which are more suitable for storage in relatively fast but small memory, such as DRAM.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 8:
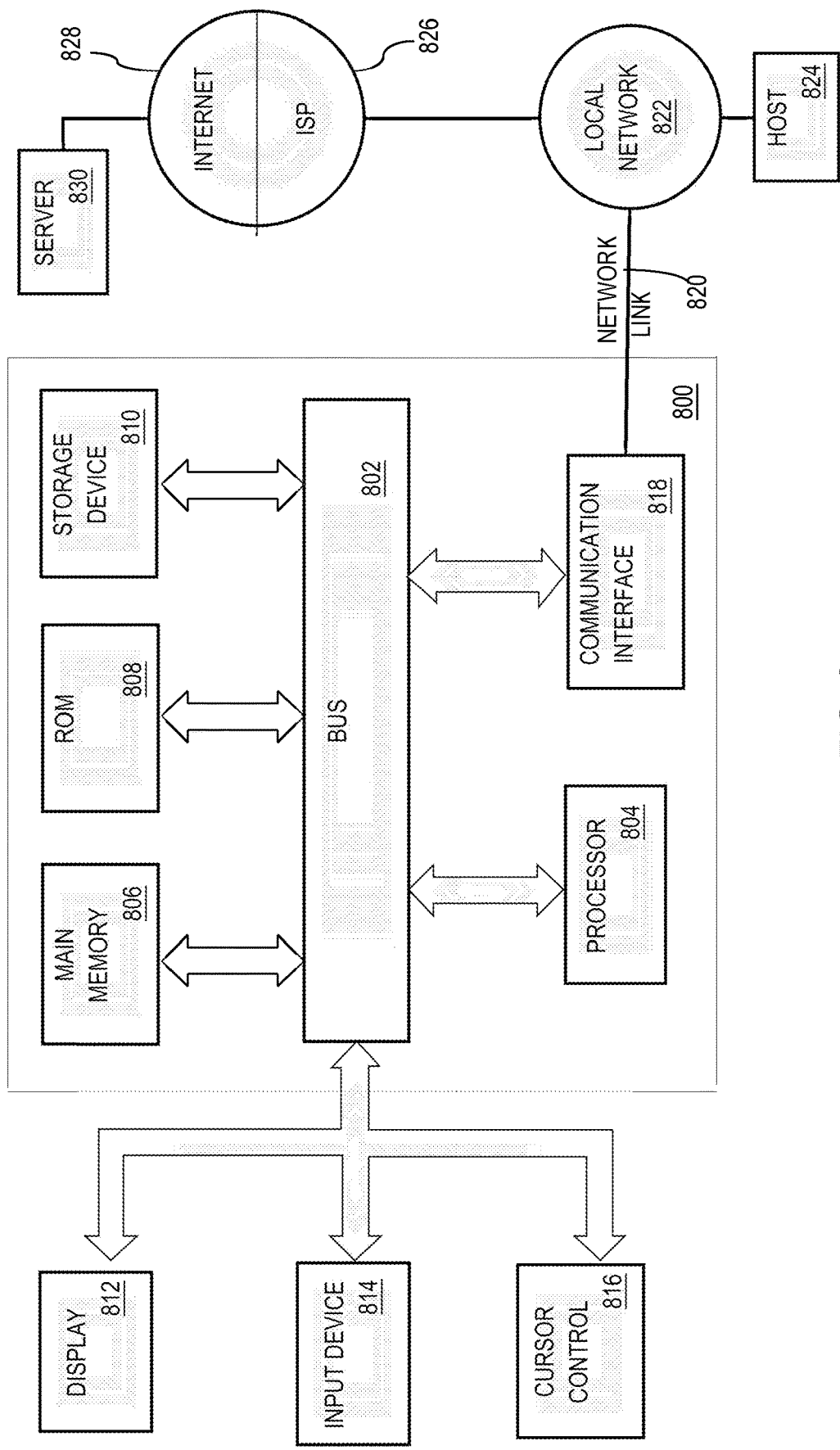
FIG. 8 depicts a computer system upon which embodiments may be implemented.

For example, FIG. 8 is a block diagram that illustrates a computer system 800 upon which an embodiment of the disclosure may be implemented. Computer system 800 includes a bus 802 or other communication mechanism for communicating information, and a hardware processor 804 coupled with bus 802 for processing information. Hardware processor 804 may be, for example, a general purpose microprocessor.

Computer system 800 also includes a main memory 806, such as a random access memory (RAM) or other dynamic storage device, coupled to bus 802 for storing information and instructions to be executed by processor 804. Main memory 806 also may be used for storing temporary variables or other intermediate information during execution of instructions to be executed by processor 804. Such instructions, when stored in non-transitory storage media accessible to processor 804, render computer system 800 into a special-purpose machine that is customized to perform the operations specified in the instructions.

Computer system 800 further includes a read only memory (ROM) 808 or other static storage device coupled to bus 802 for storing static information and instructions for processor 804. A storage device 810, such as a magnetic disk, optical disk, or solid-state drive is provided and coupled to bus 802 for storing information and instructions.

Computer system 800 may be coupled via bus 802 to a display 812, such as a cathode ray tube (CRT), for displaying information to a computer user. An input device 814, including alphanumeric and other keys, is coupled to bus 802 for communicating information and command selections to processor 804. Another type of user input device is cursor control 816, such as a mouse, a trackball, or cursor direction keys for communicating direction information and command selections to processor 804 and for controlling cursor movement on display 812. This input device typically has two degrees of freedom in two axes, a first axis (e.g., x) and a second axis (e.g., y), that allows the device to specify positions in a plane.

Computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor 804 executing one or more sequences of one or more instructions contained in main memory 806. Such instructions may be read into main memory 806 from another storage medium, such as storage device 810. Execution of the sequences of instructions contained in main memory 806 causes processor 804 to perform the process steps described herein. In alternative embodiments, hardwired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 810. Volatile media includes dynamic memory, such as main memory 806. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 802. Transmission media can also take the form of acoustic or light waves, such as those generated during radio-wave and infra-red data communications.

Various forms of media may be involved in carrying one or more sequences of one or more instructions to processor 804 for execution. For example, the instructions may initially be carried on a magnetic disk or solid-state drive of a remote computer. The remote computer can load the instructions into its dynamic memory and send the instructions over a telephone line using a modem. A modem local to computer system 800 can receive the data on the telephone line and use an infra-red transmitter to convert the data to an infra-red signal. An infra-red detector can receive the data carried in the infra-red signal and appropriate circuitry can place the data on bus 802. Bus 802 carries the data to main memory 806, from which processor 804 retrieves and executes the instructions. The instructions received by main memory 806 may optionally be stored on storage device 810 either before or after execution by processor 804.

Computer system 800 also includes a communication interface 818 coupled to bus 802. Communication interface 818 provides a two-way data communication coupling to a network link 820 that is connected to a local network 822. For example, communication interface 818 may be an integrated services digital network (ISDN) card, cable modem, satellite modem, or a modem to provide a data communication connection to a corresponding type of telephone line. As another example, communication interface 818 may be a local area network (LAN) card to provide a data communication connection to a compatible LAN. Wireless links may also be implemented. In any such implementation, communication interface 818 sends and receives electrical, electromagnetic or optical signals that carry digital data streams representing various types of information.

Network link 820 typically provides data communication through one or more networks to other data devices. For example, network link 820 may provide a connection through local network 822 to a host computer 824 or to data equipment operated by an Internet Service Provider (ISP) 826. ISP 826 in turn provides data communication services through the world wide packet data communication network now commonly referred to as the "Internet" 828. Local network 822 and Internet 828 both use electrical, electromagnetic or optical signals that carry digital data streams. The signals through the various networks and the signals on network link 820 and through communication interface 818, which carry the digital data to and from computer system 800, are example forms of transmission media.

Computer system 800 can send messages and receive data, including program code, through the network(s), network link 820 and communication interface 818. In the Internet example, a server 830 might transmit a requested code for an application program through Internet 828, ISP 826, local network 822 and communication interface 818.

The received code may be executed by processor 804 as it is received, and/or stored in storage device 810, or other non-volatile storage for later execution.

Software Overview

Figure 9:
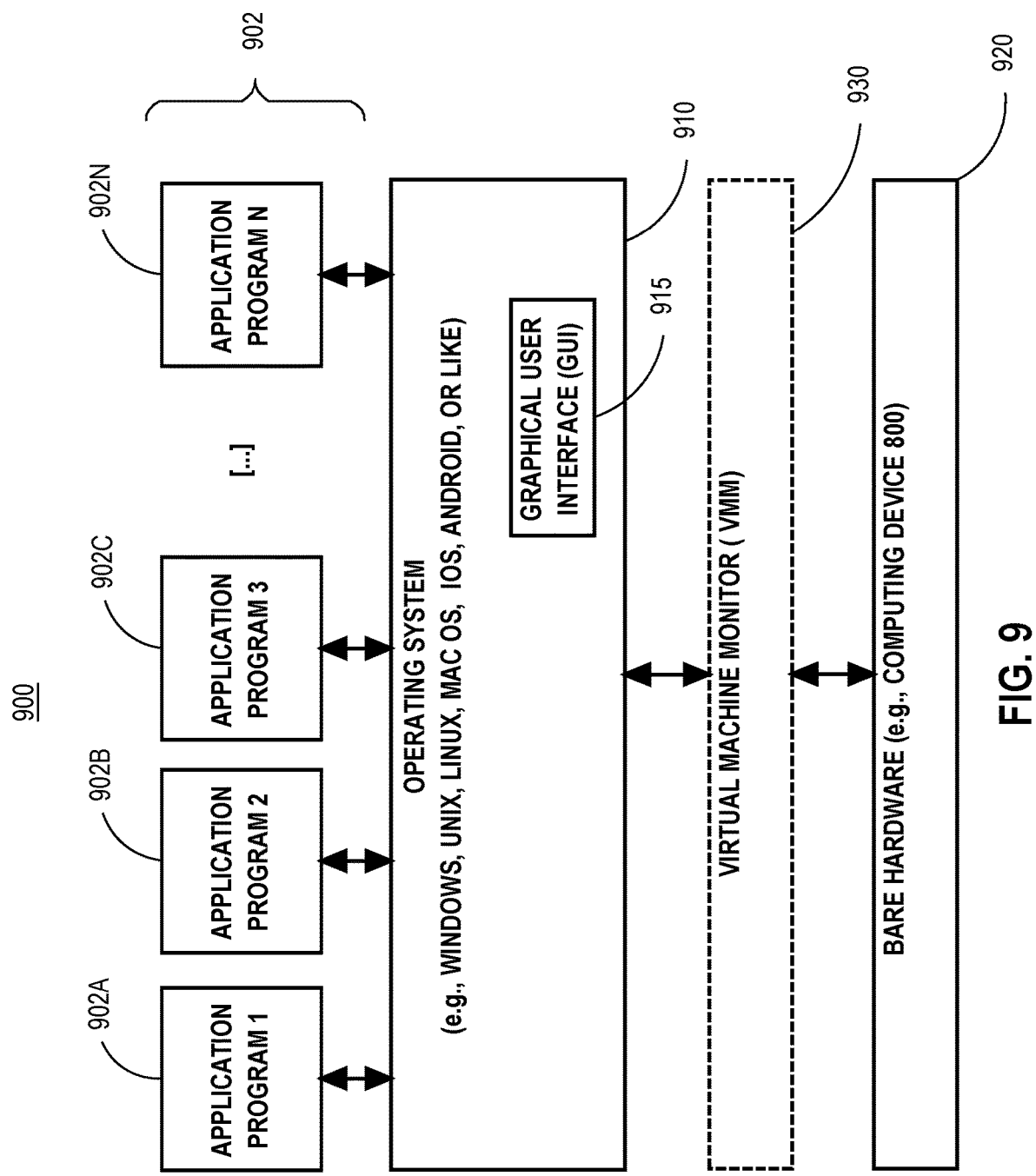
FIG. 9 depicts a software system for controlling the operation of the computer system.

FIG. 9 is a block diagram of a software system 900 that may be employed for controlling the operation of computer system 800. Software system 900 and its components, including their connections, relationships, and functions, is meant to be exemplary only, and not meant to limit implementations of the example embodiment(s). Other software systems suitable for implementing the example embodiment(s) may have different components, including components with different connections, relationships, and functions.

Software system 900 is provided for directing the operation of computer system 800. Software system 900, which may be stored in system memory (RAM) 806 and on fixed storage (e.g., hard disk or flash memory) 810, includes a kernel or operating system (OS) 910.

The OS 910 manages low-level aspects of computer operation, including managing execution of processes, memory allocation, file input and output (I/O), and device I/O. One or more application programs, represented as 902A, 902B, 902C . . . 902N, may be "loaded" (e.g., transferred from fixed storage 810 into memory 806) for execution by the system 800. The applications or other software intended for use on system 800 may also be stored as a set of downloadable computer-executable instructions, for example, for downloading and installation from an Internet location (e.g., a Web server, an app store, or other online service).

Software system 900 includes a graphical user interface (GUI) 915, for receiving user commands and data in a graphical (e.g., "point-and-click" or "touch gesture") fashion. These inputs, in turn, may be acted upon by the system 900 in accordance with instructions from operating system 910 and/or application(s) 902. The GUI 915 also serves to display the results of operation from the OS 910 and application(s) 902, whereupon the user may supply additional inputs or terminate the session (e.g., log off).

OS 910 can execute directly on the bare hardware 920 (e.g., processor(s) 804) of system 900. Alternatively, a hypervisor or virtual machine monitor (VMM) 930 may be interposed between the bare hardware 920 and the OS 910. In this configuration, VMM 930 acts as a software "cushion" or virtualization layer between the OS 910 and the bare hardware 920 of the system 800.

VMM 930 instantiates and runs one or more virtual machine instances ("guest machines"). Each guest machine comprises a "guest" operating system, such as OS 910, and one or more applications, such as application(s) 902, designed to execute on the guest operating system. The VMI 930 presents the guest operating systems with a virtual operating platform and manages the execution of the guest operating systems.

In some instances, the VMM 930 may allow a guest operating system to run as if it is running on the bare hardware 920 of system 800 directly. In these instances, the same version of the guest operating system configured to execute on the bare hardware 920 directly may also execute on VMM 930 without modification or reconfiguration. In other words, VMM 930 may provide full hardware and CPU virtualization to a guest operating system in some instances.

In other instances, a guest operating system may be specially designed or configured to execute on VMM 930 for efficiency. In these instances, the guest operating system is "aware" that it executes on a virtual machine monitor. In other words, VMM 930 may provide para-virtualization to a guest operating system in some instances.

The above-described basic computer hardware and software is presented for purpose of illustrating the basic underlying computer components that may be employed for implementing the example embodiment(s). The example embodiment(s), however, are not necessarily limited to any particular computing environment or computing device configuration. Instead, the example embodiment(s) may be implemented in any type of system architecture or processing environment that one skilled in the art, in light of this disclosure, would understand as capable of supporting the features and functions of the example embodiment(s) presented herein.

Cloud Computing

The term "cloud computing" is generally used herein to describe a computing model which enables on-demand access to a shared pool of computing resources, such as computer networks, servers, software applications, and services, and which allows for rapid provisioning and release of resources with minimal management effort or service provider interaction.

A cloud computing environment (sometimes referred to as a cloud environment, or a cloud) can be implemented in a variety of different ways to best suit different requirements. For example, in a public cloud environment, the underlying computing infrastructure is owned by an organization that makes its cloud services available to other organizations or to the general public. In contrast, a private cloud environment is generally intended solely for use by, or within, a single organization. A community cloud is intended to be shared by several organizations within a community; while a hybrid cloud comprises two or more types of cloud (e.g., private, community, or public) that are bound together by data and application portability.

Generally, a cloud computing model enables some of those responsibilities which previously may have been provided by an organization's own information technology department, to instead be delivered as service layers within a cloud environment, for use by consumers (either within or external to the organization, according to the cloud's public/private nature). Depending on the particular implementation, the precise definition of components or features provided by or within each cloud service layer can vary, but common examples include: Software as a Service (SaaS), in which consumers use software applications that are running upon a cloud infrastructure, while a SaaS provider manages or controls the underlying cloud infrastructure and applications. Platform as a Service (PaaS), in which consumers can use software programming languages and development tools supported by a PaaS provider to develop, deploy, and otherwise control their own applications, while the PaaS provider manages or controls other aspects of the cloud environment (i.e., everything below the run-time execution environment). Infrastructure as a Service (IaaS), in which consumers can deploy and run arbitrary software applications, and/or provision processing, storage, networks, and other fundamental computing resources, while an IaaS provider manages or controls the underlying physical cloud infrastructure (i.e., everything below the operating system layer). Database as a Service (DBaaS) in which consumers use a database server or Database Management System that is running upon a cloud infrastructure, while a DbaaS provider manages or controls the underlying cloud infrastructure, applications, and servers, including one or more database servers.

Extensions and Alternatives

In the foregoing specification, embodiments of the disclosure have been described with reference to numerous specific details that may vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction.

What is claimed is:

1. A method comprising:
storing, as a token-ordered tree, an encoding dictionary that maps a plurality of ordered tokens to a subset of a plurality of ordered codes, wherein a pair of adjacent nodes of said token-ordered tree comprises a first node and a second node, wherein said first node maps a first token of said plurality of ordered tokens to a first code of said plurality of ordered codes, wherein said second node maps a second token of said plurality of ordered tokens to a second code of said plurality of ordered codes, and wherein said first code and said second code are non-consecutive codes;
updating said encoding dictionary based on inserting a third node between said first node and said second node, wherein said third node maps a third token to a third code that is greater than said first code and less than said second code;
wherein said first code differs from said second code by a differential that is determined based on a difference between a cardinality of said plurality of ordered codes and a cardinality of said plurality of ordered tokens and dividing the difference by said cardinality of said plurality of ordered tokens;
wherein the method is performed by one or more computing devices.

2. The method of claim 1, further including determining said third code based on averaging said first code with said second code.

3. The method of claim 1, wherein updating said encoding dictionary is performed at runtime based on a locking protocol that supports concurrent reads and updates.

4. The method of claim 1, further including sharing said encoding dictionary across a distributed database.

5. The method of claim 1, further comprising:
updating said encoding dictionary based on inserting a sixth node between a fourth node and a fifth node, wherein said fourth node and said fifth node correspond to consecutive codes, and wherein inserting said sixth node comprises re-encoding said fifth node to make space for said sixth node.

6. The method of claim 1, further comprising:
deleting, from said token-ordered tree, a node having a reference counter that reaches zero.

7. The method of claim 1, further comprising:
scanning a column of a database table for tokens that are in use;
marking all nodes of said token-ordered tree corresponding to said tokens that are in use;
deleting any unmarked nodes of said token-ordered tree.

8. The method of claim 1, further comprising:
after updating said encoding dictionary, updating a corresponding decoding dictionary based on inserting said third token into a hash map.

9. The method of claim 8, wherein updating said corresponding decoding dictionary is performed at runtime.

10. One or more non-transitory storage media storing one or more sequences of instructions that, when executed by one or more computing devices, cause:
storing, as a token-ordered tree, an encoding dictionary that maps a plurality of ordered tokens to a subset of a plurality of ordered codes, wherein a pair of adjacent nodes of said token-ordered tree comprises a first node and a second node, wherein said first node maps a first token of said plurality of ordered tokens to a first code of said plurality of ordered codes, wherein said second node maps a second token of said plurality of ordered tokens to a second code of said plurality of ordered codes, and wherein said first code and said second code are non-consecutive codes;
updating said encoding dictionary based on inserting a third node between said first node and said second node, wherein said third node maps a third token to a third code that is greater than said first code and less than said second code; and
wherein said first code differs from said second code by a differential that is determined based on a difference between a cardinality of said plurality of ordered codes and a cardinality of said plurality of ordered tokens and dividing the difference by said cardinality of said plurality of ordered tokens;
wherein the method is performed by one or more computing devices.

11. The one or more non-transitory storage media of claim 10, wherein said one or more sequences of instructions include instructions that, when executed by said one or more computing devices, cause determining said third code based on averaging said first code with said second code.

12. The one or more non-transitory storage media of claim 10, wherein said one or more sequences of instructions include instructions that, when executed by said one or more computing devices, cause updating said encoding dictionary to be performed at runtime based on a locking protocol that supports concurrent reads and updates.

13. The one or more non-transitory storage media of claim 10, wherein said one or more sequences of instructions include instructions that, when executed by said one or more computing devices, cause sharing said encoding dictionary across a distributed database.

14. The one or more non-transitory storage media of claim 10, wherein said one or more sequences of instructions include instructions that, when executed by said one or more computing devices, cause:
updating said encoding dictionary based on inserting a sixth node between a fourth node and a fifth node, wherein said fourth node and said fifth node correspond to consecutive codes, and wherein inserting said sixth node comprises re-encoding said fifth node to make space for said sixth node.

15. The one or more non-transitory storage media of claim 10, wherein said one or more sequences of instructions include instructions that, when executed by said one or more computing devices, cause:
deleting, from said token-ordered tree, a node having a reference counter that reaches zero.

16. The one or more non-transitory storage media of claim 10, wherein said one or more sequences of instructions include instructions that, when executed by said one or more computing devices, cause:
scanning a column of a database table for tokens that are in use;
marking all nodes of said token-ordered tree corresponding to said tokens that are in use;
deleting any unmarked nodes of said token-ordered tree.

17. The one or more non-transitory storage media of claim 10, wherein said one or more sequences of instructions include instructions that, when executed by said one or more computing devices, cause:
after updating said encoding dictionary, updating a corresponding decoding dictionary based on inserting said third token into a hash map.

18. The one or more non-transitory storage media of claim 17, wherein said one or more sequences of instructions include instructions that, when executed by said one or more computing devices cause updating said corresponding decoding dictionary to be performed at runtime.

* * * * *

UNITED STATES PATENT AND TRADEMARK OFFICE
CERTIFICATE OF CORRECTION

PATENT NO. : 11,023,430 B2  
APPLICATION NO. : 15/819891  
DATED : June 1, 2021  
INVENTOR(S) : Giannikis et al.

It is certified that error appears in the above-identified patent and that said Letters Patent is hereby corrected as shown below:

On the Title Page

On page 2, Column 1, item (56) under Other Publications, Line 4, delete "dated ," and insert -- dated, --, therefor.

On page 2, Column 1, item (56) under Other Publications, Line 5, delete "darted" and insert -- dated --, therefor.

On page 2, Column 2, item (56) under Other Publications, Line 31, delete "7thBiennial" and insert -- 7th Biennial --, therefor.

On page 2, Column 2, item (56) under Other Publications, Line 37, delete "perWatt"," and insert -- per Watt", --, therefor.

In the Drawings

On sheet 9 of 9, in FIG. 9, under Reference Numeral 930, Line 1, delete "( VMM)" and insert -- (VMM) --, therefor.

In the Specification

In Column 16, Line 62, delete "VMI" and insert -- VMM --, therefor.

In Column 18, Line 6, delete "DbasS" and insert -- DBaaS --, therefor.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 11,023,430 B2

In the Claims

In Column 18, Lines 53-54, in Claim 2, delete "determiningsaid" and insert -- determining said --, therefor.

In Column 18, Line 59, in Claim 4, delete "sharingsaid" and insert -- sharing said --, therefor.